United States Patent
Lu et al.

(10) Patent No.: US 11,735,446 B2
(45) Date of Patent: Aug. 22, 2023

(54) ENHANCED SELENIUM SUPPLY IN COPPER INDIUM GALLIUM SELENIDE PROCESSES

(71) Applicant: TSMC Solar Ltd., Taichung (TW)

(72) Inventors: Wei-Lun Lu, Tainan (TW); Jyh-Lih Wu, Tainan (TW); Wen-Tsai Yen, Caotun Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 40 days.

(21) Appl. No.: 16/364,077

(22) Filed: Mar. 25, 2019

(65) Prior Publication Data

US 2019/0221459 A1     Jul. 18, 2019

Related U.S. Application Data

(62) Division of application No. 13/934,251, filed on Jul. 3, 2013, now abandoned.

(51) Int. Cl.
*H01L 21/67*     (2006.01)
*C23C 14/50*     (2006.01)
(Continued)

(52) U.S. Cl.
CPC ...... *H01L 21/67248* (2013.01); *C23C 14/243* (2013.01); *C23C 14/50* (2013.01);
(Continued)

(58) Field of Classification Search
CPC ......... H01L 21/67248; H01L 21/67109; C23C 14/243; C23C 14/50; C23C 14/5866; Y02P 70/50; Y02E 10/541
(Continued)

(56) References Cited

U.S. PATENT DOCUMENTS 4,263,872 A * 4/1981 Ban .................. C23C 16/4584
                                            118/721
5,266,118 A * 11/1993 Mitra ..................... C23C 14/22
                                            118/728

(Continued)

FOREIGN PATENT DOCUMENTS

JP        03006366 A * 1/1991
JP        H036366 A    1/1991

OTHER PUBLICATIONS

Official Action dated Mar. 24, 2016 in counterpart Chinese Patent Application No. 2016032101427280.

*Primary Examiner* — Charlee J. C. Bennett
(74) *Attorney, Agent, or Firm* — Duane Morris LLP

(57) ABSTRACT

A substrate carrier, includes: a unitary body fabricated from a single block of graphite, wherein the body comprises a back plate, and a pair of spaced apart, substantially parallel, side rails, wherein each of the side rails comprises: an inwardly facing surface extending outwardly of the back plate; a longitudinally extending selenium vapor bore formed therein, a top end of the selenium vapor bore being open and configured for coupling to a selenium supply container for receiving selenium vapor by gravity, a bottom end of the selenium vapor bore being closed; an inwardly directed selenium vapor channel; a plurality of selenium vapor outlets disposed between the selenium vapor bore and the inwardly directed selenium vapor channel so as provide a plurality of conduits between the selenium vapor bore and the selenium vapor channel; and, a longitudinally extending engagement slot formed in the inwardly facing surface of each side rail adjacent the back plate to engage and hold a substrate in proximity to the back plate.

20 Claims, 5 Drawing Sheets

(51) Int. Cl.
   *C23C 14/58*    (2006.01)
   *C23C 14/24*    (2006.01)
   *H01L 31/032*   (2006.01)

(52) U.S. Cl.
   CPC .... *C23C 14/5866* (2013.01); *H01L 21/67109* (2013.01); *H01L 31/0322* (2013.01); *Y02E 10/541* (2013.01); *Y02P 70/50* (2015.11)

(58) Field of Classification Search
   USPC ........................................................ 118/725
   See application file for complete search history.

(56) References Cited

U.S. PATENT DOCUMENTS

| | | | |
|---|---|---|---|
| 5,354,580 A | 10/1994 | Goela | |
| 2002/0034883 A1 | 3/2002 | Klein | |
| 2004/0206305 A1* | 10/2004 | Choi | C23C 16/5096 |
| | | | 118/715 |
| 2004/0219789 A1* | 11/2004 | Wood | H01L 21/31116 |
| | | | 257/E21.252 |
| 2007/0116893 A1* | 5/2007 | Zwaap | C23C 14/5866 |
| | | | 427/591 |
| 2009/0000552 A1* | 1/2009 | Sohda | H01L 21/67288 |
| | | | 118/728 |
| 2012/0021556 A1* | 1/2012 | Beck | H01L 31/0322 |
| | | | 118/724 |
| 2014/0318456 A1* | 10/2014 | Shin | C23C 16/4585 |
| | | | 118/725 |

* cited by examiner

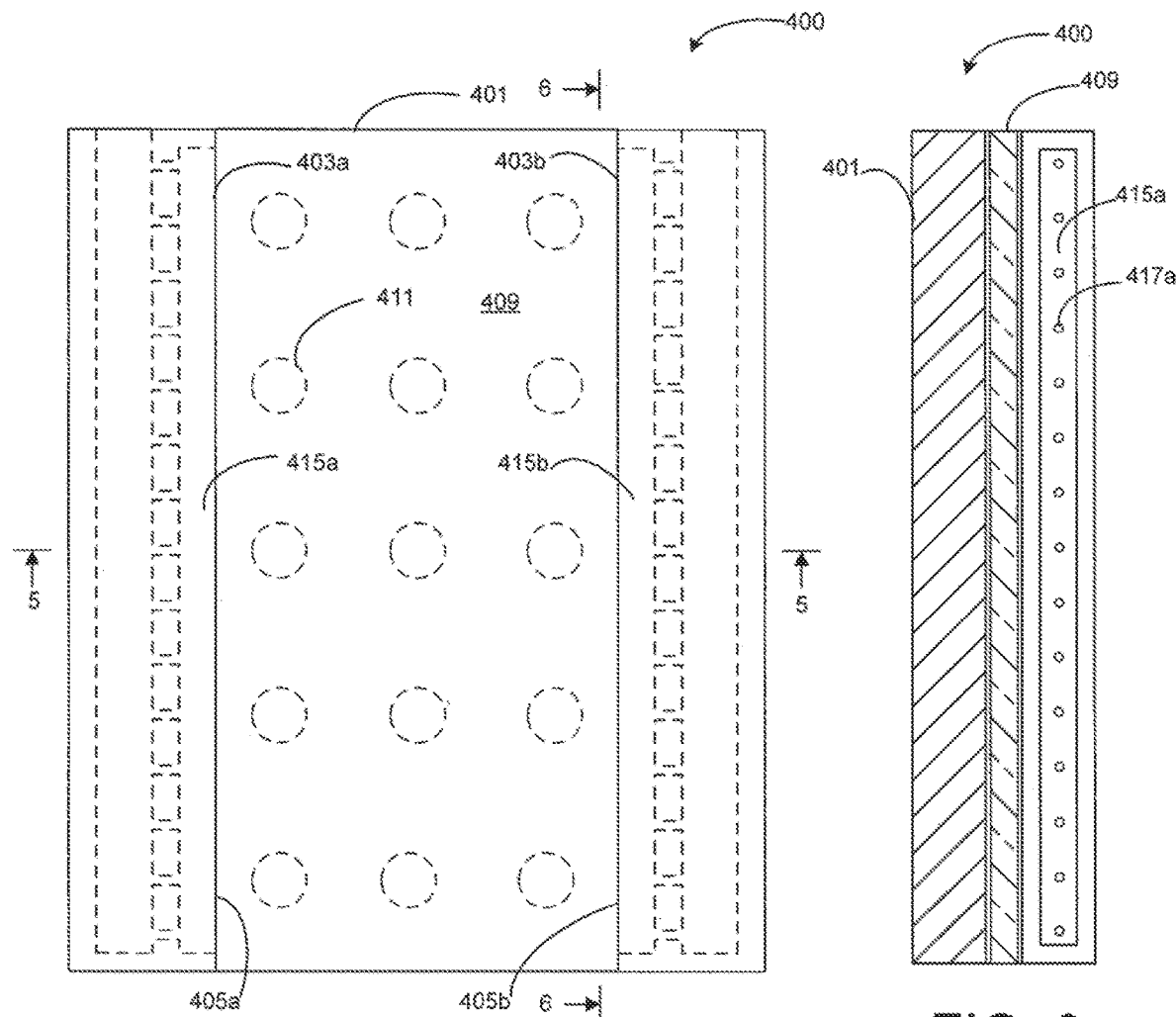
FIG. 4
FIG. 6
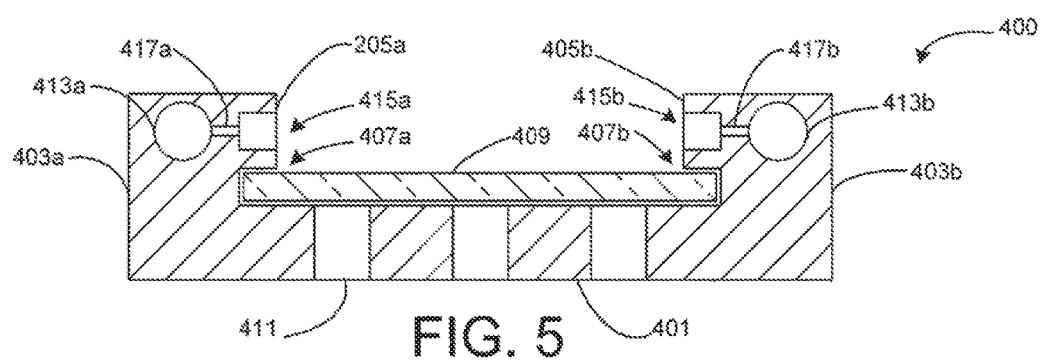
FIG. 5

ENHANCED SELENIUM SUPPLY IN COPPER INDIUM GALLIUM SELENIDE PROCESSES

This application is a divisional of U.S. patent application Ser. No. 13/934,251, filed Jul. 3, 2013, the entirety of which is incorporated herein by reference.

BACKGROUND

This disclosure relates generally to the manufacture of copper indium gallium selenide (CIGS) photovoltaic cells and/or panels, and more particularly to methods, devices and systems for enhancing the selenium supplied in such manufacturing processes.

Copper indium gallium selenide (CIGS) is a semiconductor material useful for the manufacture of solar cells. The CIGS absorber is deposited on a glass or plastic substrate, along with electrodes on the front and back to collect current. The material has a high absorption coefficient and strongly absorbs sunlight. Accordingly, a thinner CIGS film is required than those of other semiconductor photovoltaic materials.

CIGS films are typically made by first depositing copper, indium and gallium on the substrate and then exposing the precursor layers to selenium at a high temperature. The selenium supply and selenization environment are extremely important in determining the properties and quality of the film produced from precursor layers. When Se is supplied in the gas phase (for example as H2Se or elemental Se) at high temperatures the Se will become incorporated into the film by absorption and subsequent diffusion. During this step, called chalcogenization, complex interactions occur to form a chalcogenide. These interactions include formation of Cu—In—Ga intermetallic alloys, formation of intermediate metal-selenide binary compounds, and phase separation of various stoichiometric CIGS compounds.

A particular problem in selenization is supplying sufficient selenium to the precursor layers. Current techniques provide small coverage area of selenium deposition. Also, current techniques have not provided for in-situ monitor, which leads to uncertainty in what is actually occurring during processing. Because of the variety and complexity of the reactions taking place, the properties of the CIGS film have difficult to control.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

FIG. 4 is a side view of a second substrate carrier in accordance with various embodiments of the present disclosure.

FIG. 5 is a section view taken along line 5-5 of FIG. 4.

FIG. 6 is a section view taken along line 6-6 of FIG. 4.

DETAILED DESCRIPTION

Figure 1:
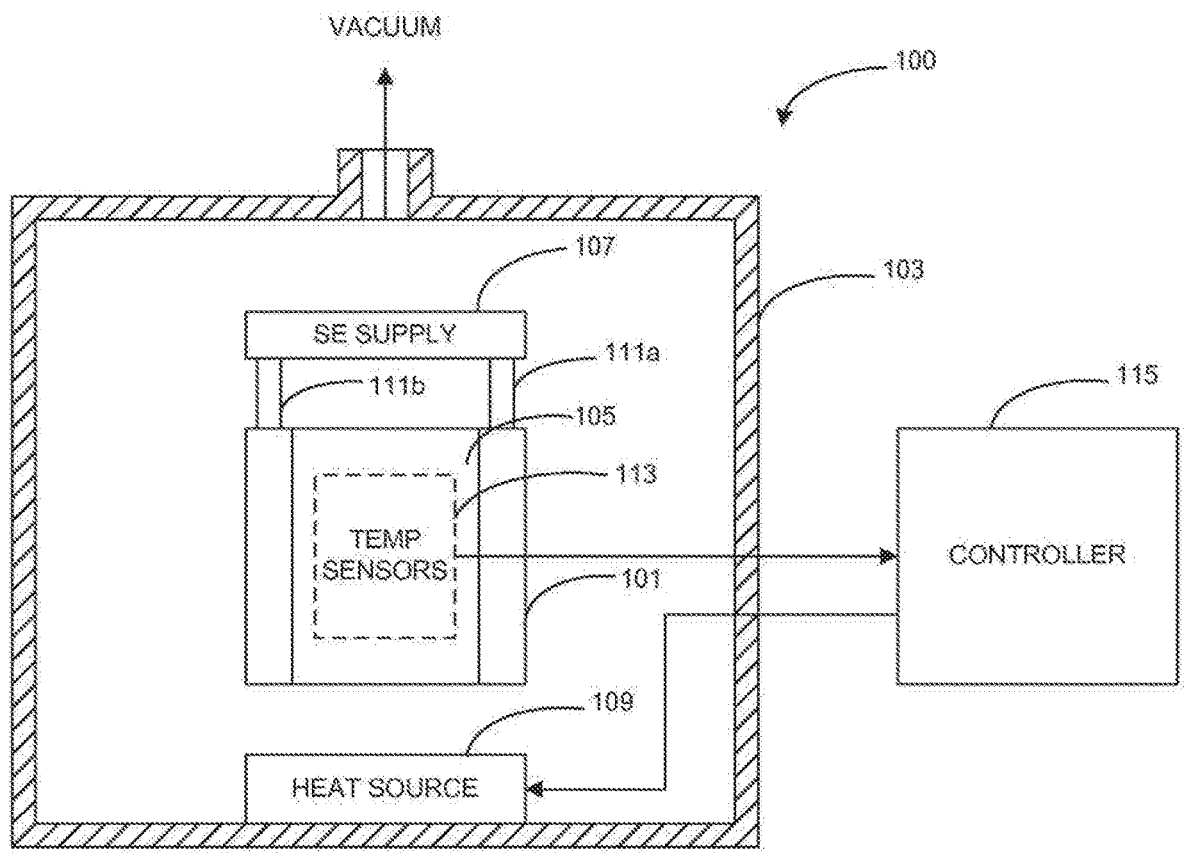
FIG. 1 is a side section view of a selenium supply system in accordance with various embodiments of the present disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning coupling and the like, such as "connected" and "interconnected," refer to a relationship wherein devices or nodes are in direct or indirect electrical communication, unless expressly described otherwise.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Referring now to the drawings, and first to FIG. 1, a system according to an embodiment of the present disclosure is designated generally by the numeral 100. System 100 includes a substrate carrier 101 contained in a vacuum chamber 103. As will described in detail hereinafter, substrate carrier 101 as adapted to carry a substrate 105 during exposure to selenium vapor will be applied in accordance with embodiments of the present disclosure. Substrate 105 has copper, indium and/or gallium applied thereto by other processes prior to the application of selenium according to embodiments of the present disclosure. Substrate carrier 101 may be fabricated from graphite, as will be described in detail hereinafter.

In some embodiments, the substrate 105 is a photovoltaic solar cell substrate. Suitable materials for the underlying substrate include for example without limitation, glass (such as soda lime glass), ceramic, metals such as thin sheets of stainless steel and aluminum, or polymers such as polyamides, polyethylene terephthalates, polyethylene naphthalates, polymeric hydrocarbons, cellulosic polymers, polycarbonates, polyethers, combinations thereof, or the like. A back electrode (e.g., Molybdenum) is formed over the substrate. The absorber film is formed over the back electrode.

In some embodiments, the absorber material is copper indium gallium (di)selenide (CIGS), a I-III-VI2 semiconductor material composed of copper, indium, gallium, and selenium. CIGS is a solid solution of copper indium selenide (often abbreviated "CIS") and copper gallium selenide.

CIGS is a tetrahedrally bonded semiconductor, with the chalcopyrite crystal structure, and a bandgap varying continuously with x from about 1.0 eV (for copper indium selenide) to about 1.7 eV (for copper gallium selenide).

In an embodiment, the photovoltaic may comprise a p-type material. For example, the absorber layer can be a p-type chalcogenide material. In a further embodiment, the absorber layer can be a CIGS Cu(In,Ga)Se2 material. In other embodiments, chalcogenide materials including, but not limited to, Cu(In,Ga)(Se, S)2 or "CIGSS," CuInSe2, CuGaSe2, CuInS2, and Cu(In,Ga)S2. can be used as an absorber layer material. Suitable p-type dopants that can be used for forming absorber layer include without limitation boron (B) or other elements of group II or III of the periodic table. In another embodiment, the absorber layer may comprise an n-type material including, without limitation, cadmium sulfide (CdS).

System 100 includes a selenium supply container 107, which is adapted to receive and contain solid selenium in the form of slugs, particles or the like. A heat source 109 is provided in vacuum chamber 103 to heat substrate carrier 101 and substrate 105 to an appropriate process temperature, in a range about 500° Celsius to about 550° Celsius, and to vaporize the solid selenium contained in selenium supply container 107. Selenium supply container 107 may be coupled by tubes 111*a* and 111*b* or the like to provide a flux of selenium vapor to substrate carrier 101 and then substrate 105 under the influence of gravity. Selenium supply container 107 and tubes 111*a* and 111*b* may be made of graphite, silicon carbide, molybdenum and/or tantalum, or other suitable material, capable of withstanding the high process temperatures.

As will be described in detail hereinafter, substrate carrier 101 carries one or more temperature sensors, indicated generally at 113. Temperature sensors 113 are position in contact with or in close proximity to substrate 105. Temperature sensors 113 enable in-situ monitoring of the temperature of substrate 105 during processing. Temperature sensors 113 may comprise thermocouples.

Temperature sensors 113 and heat source 109 are coupled to a controller 115, which may include a suitably programmed computer with hardware and software interfaces to communicate with temperature sensors 113 and heat source 109. Controller 115 is adapted to maintain substrate 105 at a substantially constant temperature in the process range and to detect a characteristic temperature drop during the application of the selenium vapor to the substrate due to phase changes and reactions occurring during processing.

Figure 2:
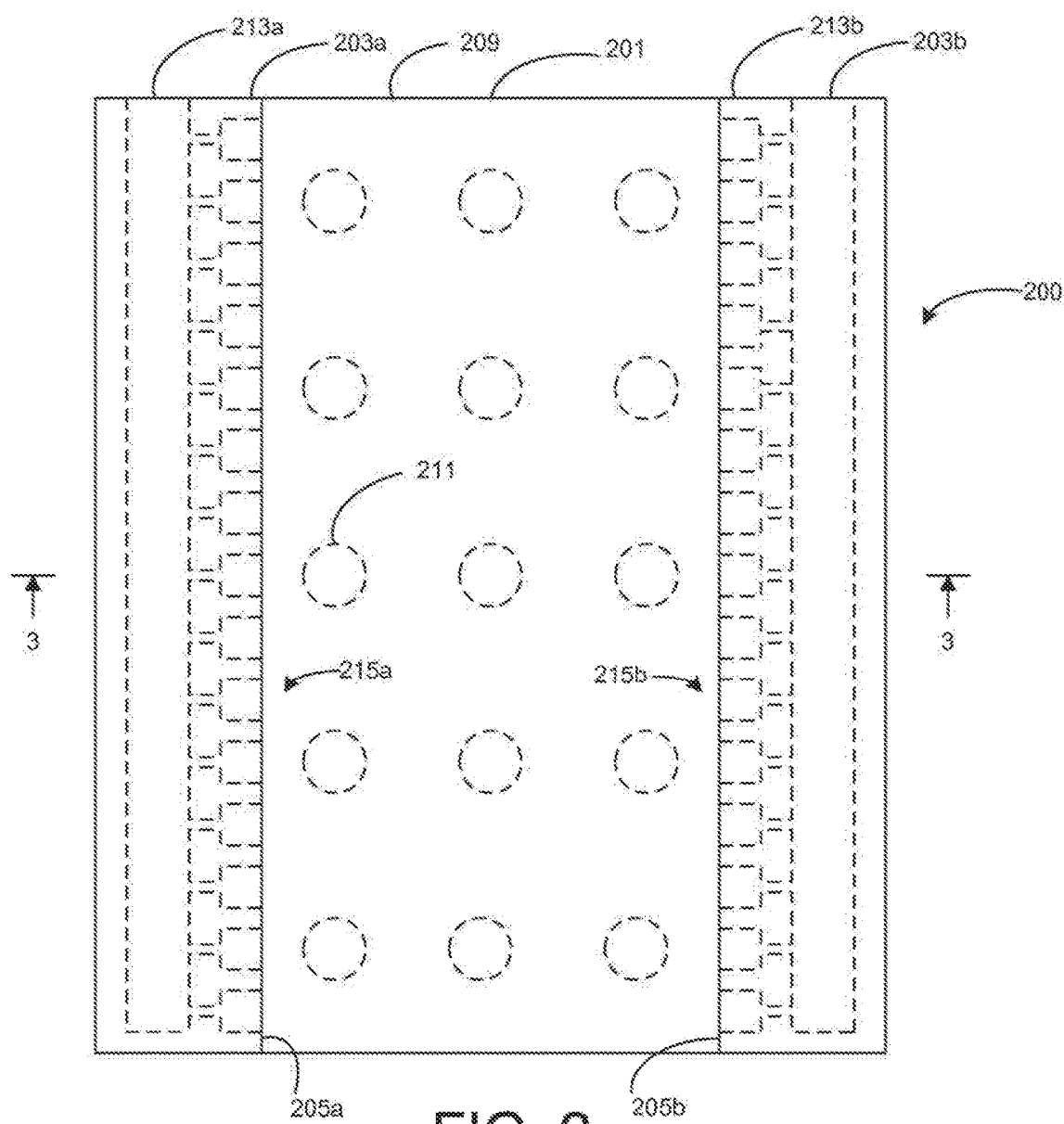
FIG. 2 is a side view of a first substrate carrier in accordance with various embodiments of the present disclosure.
Figure 3:
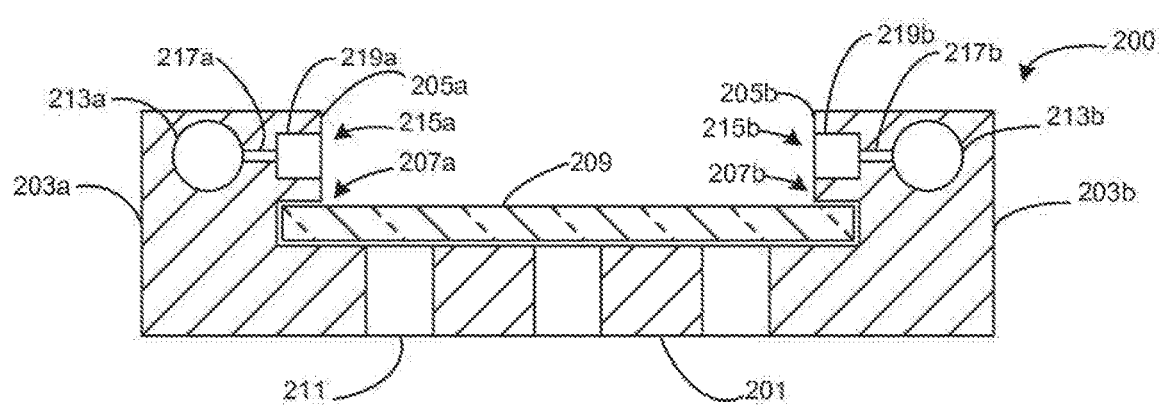
FIG. 3 is section view taken along line 3-3 of FIG. 2.

Referring now to FIGS. 2 and 3, a first embodiment of a substrate carrier is designated generally by the number 200. Substrate carrier 200 may be fabricated from a single rectangular block of graphite using conventional milling and boring machines, such as numerically controlled machines. Substrate carrier 200 includes a rectangular back plate 201 and a pair of spaced apart side rails 203*a*-203*b* extending outwardly from back plate 201. Side rails 203*a*-203*b* are substantial mirror images of each other and each includes an inwardly facing surface 205*a*-205*b*. Each inwardly facing surface 205*a*-205*b* is machined to include a longitudinally extending engagement slot 207*a*-207*b* adjacent back plate 201. Engagement slots 207*a*-207*b* engage and hold a substrate 209 against or in proximity to back plate 201. Although not shown in the drawings, the outwardly facing side of substrate 209, opposite the side facing back plate 201, has a thin layer of precursor copper, indium and/or gallium applied thereto prior to being inserted into substrate carrier 200. Back plate 201 has formed therein one or more sensor holder bores 211, which are adapted to receive and position in contact with or in proximity to substrate 209 one or more temperature sensors, such as thermocouples (not shown).

Each side rail 203 has formed therein a longitudinally extending selenium vapor bore 213*a*-213*b*. As shown in FIG. 2, each selenium vapor bore 213*a*-213*b* is open at its top end and closed at its bottom end. The top end of each selenium vapor bore 213*a*-213*b* is adapted to be coupled to tubes 111*a*-111*b* and receive selenium vapor from selenium supply container 107 of FIG. 1. Selenium vapor flows into and fills selenium vapor bores 213*a*-213*b* under the influence of gravity.

Each side rail 203*a*-203*b* also has formed therein a plurality of longitudinally spaced apart selenium vapor outlets 215*a*-215*b*. Selenium vapor outlets 215*a*-215*b* are positioned outwardly from engagement slot 207*a*-207*b* and allow the flux of selenium vapor to flow from selenium vapor bores 213*a*-213*b* onto substrate 209. In the embodiment of FIGS. 2 and 3, each selenium vapor outlet 215 includes a relatively small diameter conduit 217, in communication with selenium vapor bore 213*a*-213*b*, and a larger diameter conduit 219, in communication with inwardly facing surface 205*a*-205*b*.

Referring now to FIGS. 4-6, a second embodiment of a substrate carrier is designated generally by the number 400. Substrate carrier 400 is similar to substrate carrier 200, of FIGS. 2 and 3, and it too may be fabricated from a single rectangular block of graphite using conventional milling and boring machines, such as numerically controlled machines. Substrate carrier 400 includes a rectangular back plate 401 and a pair of spaced apart side rails 403*a*-403*b* extending outwardly from back plate 401. Side rails 403*a*-403*b* are substantial mirror images of each other and each includes an inwardly facing surface 405*a*-405*b*. Each inwardly facing surface 405*a*-405*b* is machined to include a longitudinally extending engagement slot 407*a*-407*b* adjacent back plate 401. Engagement slots 407*a*-407*b* engage and hold a substrate 409 against or in proximity to back plate 401. Back plate 401 has formed therein one or more sensor holder bores 411, which are adapted to receive and position in contact with or in proximity to substrate 409 one or more temperature sensors, such as thermocouples (not shown).

Each side rail 403*a*-403*b* has formed therein a longitudinally extending selenium vapor bore 413*a*-413*b*. As shown in FIG. 4, each selenium vapor bore 413*a*-413*b* is open at its top end and closed at its bottom end. The top end of each selenium vapor bore 413*a*-413*b* is adapted to be coupled to tubes 111*a*-111*b* and receive selenium vapor from selenium supply container 107 of FIG. 1. Selenium vapor flows into and fills selenium vapor bores 413*a*-413*b* under the influence of gravity.

Substrate carrier 400 differs from substrate carrier 200 of FIGS. 2 and 3 in the configuration of its selenium vapor outlets. More particularly, each side rail 403*a*-403*b* has formed therein a longitudinally extending selenium vapor channel 415*a*-415*b* parallel to engagement slot 407*a*-407*b*. A plurality of longitudinally spaced apart selenium vapor outlets 417 connect selenium vapor bores 413*a*-413*b* with selenium vapor channels 415*a*-415*b*. Selenium vapor outlets 417 allow the flux of selenium vapor to flow from selenium vapor bores 413*a*-413*b* into selenium vapor channels 415*a*-415*b* and then onto substrate 409.

Figure 7:
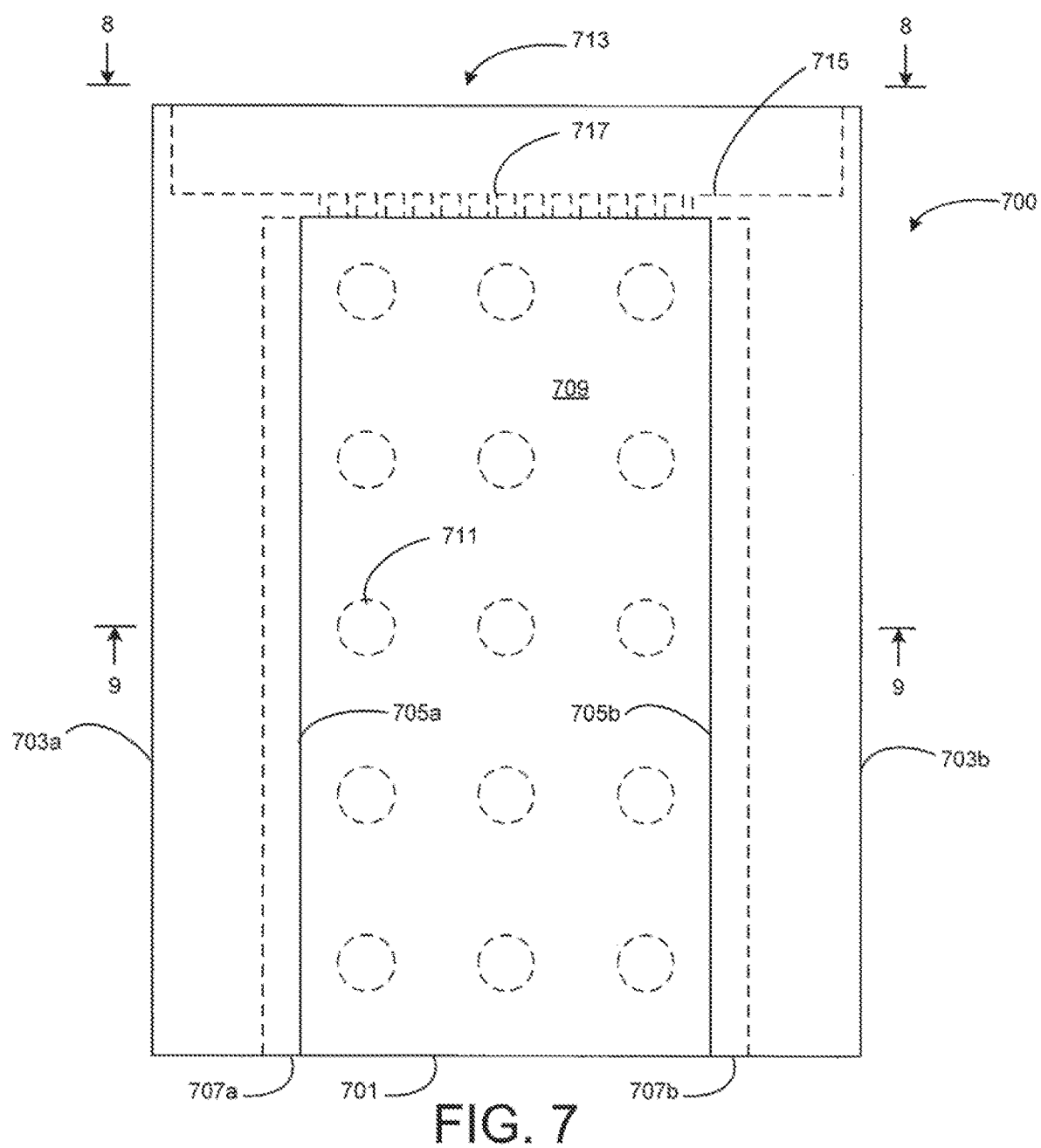
FIG. 7 is a side view of a third substrate carrier in accordance with various embodiments of the present disclosure.
Figure 8:
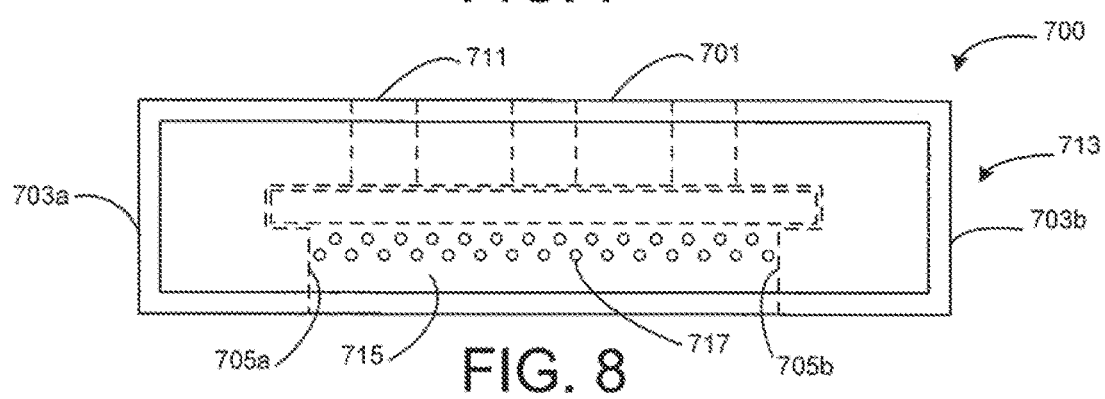
FIG. 8 is a top view of the third substrate carrier taken along line 8-8 of FIG. 7.
Figure 9:
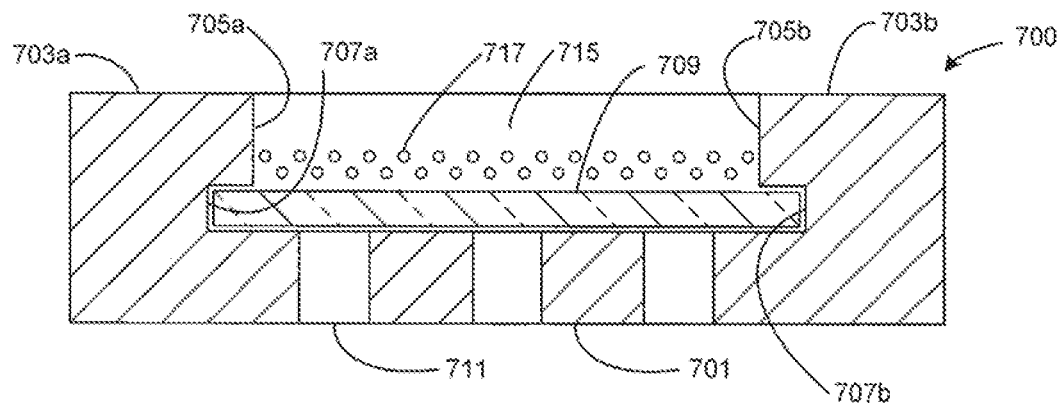
FIG. 9 is section view taken along line 9-9 of FIG. 7.

Referring now to FIGS. 7-9, a third embodiment of a substrate carrier is designated generally by the number 700. Substrate carrier 700 is similar to substrate carriers 200 and 400, and it too may be fabricated from a single rectangular block of graphite using conventional milling and boring machines. Substrate carrier 700 includes a rectangular back plate 701 and a pair of spaced apart side rails 703a-703b extending outwardly from back plate 701. Side rails 703a-703b are substantial mirror images of each other and each includes an inwardly facing surface 705a-705b. Each inwardly facing surface 705a-705b is machined to include a longitudinally extending engagement slot 707a-707b adjacent back plate 701. Engagement slots 707a-707b engage and hold a substrate 709 against or in proximity to back plate 701. Back plate 701 has formed therein one or more sensor holder bores 711, which are adapted to receive and position in contact with or in proximity to substrate 709 one or more temperature sensors, such as thermocouples (not shown).

Substrate carrier 700 differs from substrate carriers 200 and 400 in that side rails 703a-703b do not include longitudinally extending bores connectable to a selenium supply container via tubes. Rather, substrate carrier 700 includes an integral selenium supply container 713. Selenium supply container is a rectangular, box-like, structure formed by side walls on top of side rails 703a-703b and back plate 701 into which solid selenium slugs (not shown), or the like, may be deposited. Selenium supply container 713 includes a shelf portion 715 that extends between side rails 703a-703b. Shelf portion 715 has formed therein plurality selenium vapor ports 717 outward of engagement slots 707a-707b. Selenium vapor ports 717 allow a flux of selenium vapor formed in selenium supply container 713 to flow over substrate 709.

Figure 10:
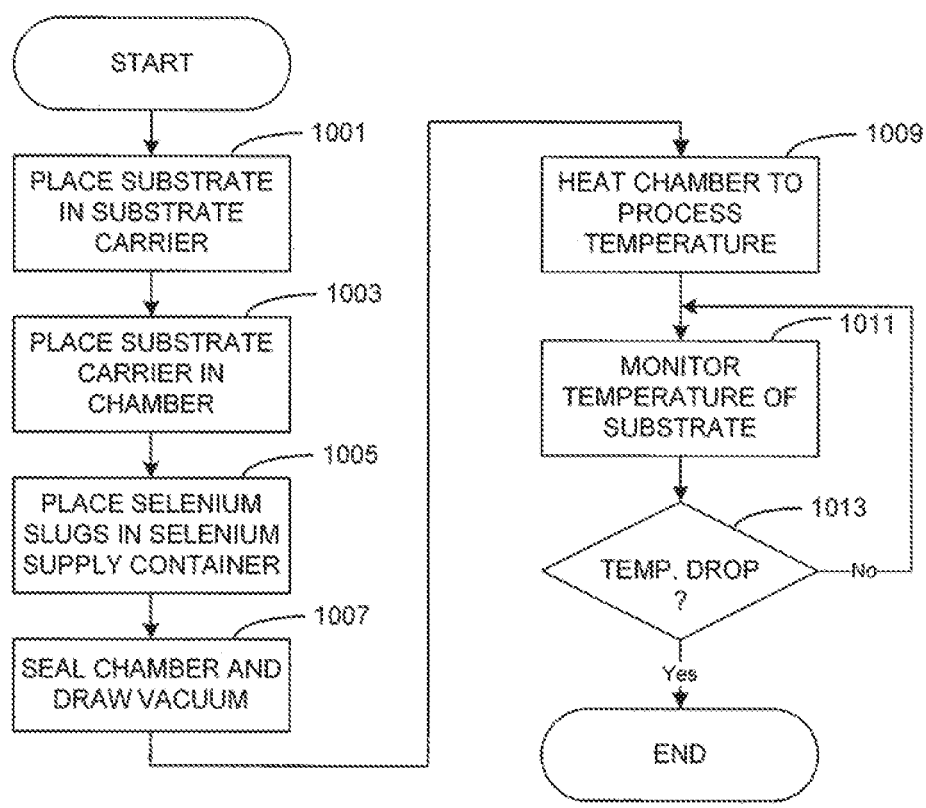
FIG. 10 is a flow chart if a process in accordance with various embodiments of the present disclosure.

FIG. 10 is a flow chart of an embodiment of a process according to the present disclosure. The substrate is placed in the substrate carrier, at block 1001. Then, the substrate carrier is placed in the process chamber, at block 1003, and a supply of selenium slugs is placed in the selenium supply chamber, at block 1005. After the substrate carrier is place in the process chamber and the selenium supply container is supplied with selenium slugs, the chamber is sealed and evacuated, at block 1007. When the chamber is evacuated, the heat source is actuated to heat the chamber to the process temperature, e.g. about 500° C. to about 550° C., at block 1009. After the chamber reaches the process temperature, the system monitors the temperature of the substrate, at block 1011. The system continues to monitor the temperature of the substrate until it detects the characteristic temperature drop of about 3° C. or 4° C., at decision block 1013, whereupon the process is ended.

In some embodiments, a substrate carrier comprises: a body including a back plate and a pair of spaced apart, substantially parallel, side rails on the back plate, each side rail including an inwardly facing surface extending outwardly of the back plate; and a longitudinally extending engagement slot formed in the inwardly facing surface of each side rail adjacent the back plate to engage and hold the substrate in proximity to the back plate.

In some embodiments, the substrate carrier includes: a longitudinally extending selenium vapor bore formed in each of the side rails; and a plurality of inwardly directed selenium vapor outlets formed in each side rail outwardly of the engagement slot and in communication with the selenium vapor bore and the inwardly facing surface.

In some embodiments, the selenium vapor outlets include a first outlet conduit in communication with the bore and a second outlet conduit in communication with the first outlet conduit and the inwardly facing surface.

In some embodiments, the second outlet conduit is larger than the first outlet conduit.

In some embodiments, the outlet conduits each have a circular cross section and are concentric with each other.

In some embodiments, the substrate carrier includes a longitudinally extending selenium vapor channel formed in the inwardly facing surface of each side rail outwardly of the engagement slot; and a plurality of inwardly directed selenium vapor outlets formed in each side rail and in communication with the selenium vapor bore and the selenium vapor channel.

In some embodiments, the selenium vapor outlets are substantially uniformly spaced apart along the inwardly facing surface of each side rail.

In some embodiments, the substrate carrier includes a temperature sensor holder formed in the back plate.

In some embodiments, the substrate carrier includes a plurality of temperature sensor holders formed in the back plate.

In some embodiments, the substrate carrier includes a selenium supply container formed in an end of the body adjacent the back plate and the side rails, the selenium supply container including a shelf portion extending between the side rails outwardly of the engagement slot, and the shelf portion having formed therein a plurality of selenium vapor ports outwardly of the engagement slots.

In some embodiments, the body is substantially rectangular.

In some embodiments, the rails are positioned on opposite sides of the back plate.

In some embodiments, the body comprises graphite.

In some embodiments, a system for depositing selenium on a substrate comprises: a substrate carrier including a body, means for holding the substrate, and a plurality of selenium vapor outlets formed in the body to direct a flux of selenium vapor onto the substrate; a selenium supply container coupled to provide selenium vapor to the selenium vapor outlets; at least one temperature sensor coupled to the substrate carrier to sense temperature of the substrate; a heat source positioned to heat the substrate; and, a controller coupled to the temperature sensor and the heat source.

In some embodiments, a system for depositing selenium on a substrate comprises: a substrate carrier including a body, means for holding the substrate, and a plurality of selenium vapor outlets formed in the body to direct a flux of selenium vapor onto the substrate; a selenium supply container coupled to provide selenium vapor to the selenium vapor outlets; at least one temperature sensor coupled to the substrate carrier to sense temperature of the substrate; a heat source positioned to heat the substrate; and, a controller coupled to the temperature sensor and the heat source.

In some embodiments, the carrier includes a back plate; the means for holding the substrate includes a pair of spaced apart, substantially parallel, side rails on the back plate, each side rail including an inwardly facing surface extending outwardly of the back plate, a longitudinally extending engagement slot formed in the inwardly facing surface of each side rail adjacent the back plate to engage and hold the substrate in proximity to the back plate; and, wherein the plurality selenium vapor outlets are formed in each side rail outwardly of the engagement slot.

In some embodiments, each selenium vapor outlet is in communication with a selenium vapor bore formed in the side rail and the inwardly facing surface of the side rail. In some embodiments, each selenium vapor bore is coupled to the selenium supply container by a tube.

In some embodiments, the selenium supply container is integral with the body, and the selenium supply container includes a shelf positioned above the means for holding the substrate, and the shelf portion has formed therein the plurality of selenium vapor outlets.

In some embodiments, the body comprises graphite.

In some embodiments, a process of depositing selenium on a substrate comprises: placing a substrate in a carrier, the carrier carrying at least one temperature sensor, the carrier having a plurality of selenium vapor outlets positioned to direct selenium vapor on to the substrate; vaporizing solid selenium to form a selenium vapor flux; coupling the selenium vapor flux to the selenium vapor outlets; and, monitoring temperature sensed by the at least one temperature sensor.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

The above-described embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

While preferred embodiments of the present subject matter have been described, it is to be understood that the embodiments described are illustrative only and that the appended claims shall be accorded a full range of equivalents, many variations and modifications naturally occurring to those of skill in the art from a perusal hereof.

What is claimed is:

1. A system for performing a selenization process, comprising:
   a unitary body fabricated from a single block of graphite, wherein the unitary body comprises a back plate, and a pair of spaced apart, substantially parallel, side rails, wherein each of the side rails comprises:
   an inwardly facing surface extending outwardly of the back plate;
   a longitudinally extending selenium vapor bore formed therein, a top end of the selenium vapor bore being open and configured to couple to a selenium supply container for receiving selenium vapor by gravity, a bottom end of the selenium vapor bore being closed;
   a plurality of selenium vapor outlets disposed between the selenium vapor bore and the inwardly facing surface so as provide a plurality of conduits between the selenium vapor bore and the inwardly facing surface;
   a longitudinally extending engagement slot formed in the inwardly facing surface of each side rail adjacent the back plate to engage and hold a substrate in proximity to the back plate;
   a heat source positioned to heat the substrate in range of 500 to 550 degrees Celsius;
   a temperature sensor configured to measure a temperature of the substrate; and
   a controller coupled to the heat source and the temperature sensor, wherein the controller is configured to control the heat source to maintain the substrate at a substantially constant temperature and, based on at least one signal from the temperature sensor, to determine whether the substrate experiences a temperature drop of three to four degrees Celsius during application of the selenium vapor to the substrate due to phase changes and reactions occurring during processing,
   wherein when the controller determines the temperature drop of three to four degrees Celsius, the controller is further configured to turn off the heat source and end the selenization process.

2. The system of claim 1, wherein the plurality of selenium vapor outlets each is smaller than the longitudinally extending selenium vapor bore and an inwardly directed selenium vapor channel coupled to the selenium vapor bore.

3. The system of claim 1, wherein each of the plurality of selenium vapor outlets has a circular cross section.

4. The system of claim 1, wherein the plurality of selenium vapor outlets is substantially uniformly spaced apart longitudinally.

5. The system of claim 1, wherein an inwardly directed selenium vapor channel extends longitudinally and is formed in the inwardly facing surface of each side rail outwardly of the engagement slot.

6. The system of claim 1, wherein the body is configured for holding a substantially rectangular substrate within the longitudinally extending engagement slots.

7. The system of claim 1, wherein the back plate further comprises a plurality of sensor holder bores extending from a front face of the back plate to a back face of the back plate.

8. The system of claim 1, wherein the rails are positioned on opposite sides of the back plate.

9. The system of claim 1, further comprising:
   a plurality of temperature sensors in contact with or in proximity to the substrate through a plurality of sensor holder bores.

10. A system for performing a selenization process, comprising:
    a substrate carrier comprising a unitary body fabricated from a single block of graphite, wherein the unitary body comprises:
    a back plate, and a pair of spaced apart, substantially parallel side rails, each side rail including an inwardly facing surface extending outwardly of the back plate, a longitudinally extending engagement slot formed in the inwardly facing surface of each side rail adjacent the back plate to engage and hold a substrate in proximity to the back plate, a longitudinally extending selenium vapor bore formed therein, a plurality of selenium vapor outlets disposed between the selenium vapor bore and the inwardly facing surface so as to provide a plurality of conduits between the selenium vapor bore and the inwardly facing surface and to direct a flux of selenium vapor from the selenium vapor bore onto the substrate through the inwardly facing surface;

a selenium supply container coupled to provide selenium vapor to a selenium vapor channel through the selenium vapor bore and the plurality of selenium vapor outlets, a top end of each selenium vapor bore being open and coupled to the selenium supply container by tubes for receiving selenium vapor by gravity, a bottom end of each selenium vapor bore being closed;

at least one temperature sensor coupled to the back plate to sense temperature of the substrate;

a heat source positioned to heat the substrate in range of 500 to 550 degrees Celsius; and a controller coupled to the at least one temperature sensor and the heat source, wherein the controller is configured to control the heat source to maintain the substrate at a substantially constant temperature and, based on at least one signal from the at least one temperature sensor, to determine whether the substrate experiences a temperature drop of three to four degrees Celsius during application of the selenium vapor to the substrate due to phase changes and reactions occurring during processing, wherein when the controller determines the temperature drop of three to four degrees Celsius, the controller is further configured to turn off the heat source and end the selenization process.

11. The system of claim 10, wherein the plurality of selenium vapor outlets each is smaller than the longitudinally extending selenium vapor bore and an inwardly directed selenium vapor channel coupled to the selenium vapor bore.

12. The system of claim 10, wherein the plurality of selenium vapor outlets each have a circular cross section.

13. The system of claim 10, wherein the plurality of selenium vapor outlets is substantially uniformly spaced apart longitudinally.

14. The system of claim 10, wherein the selenium vapor channel extends longitudinally and is formed in the inwardly facing surface of each side rail outwardly of the engagement slot.

15. The system of claim 10, wherein the back plate has a plurality of sensor holder bores, each sensor holder bore is adapted to receive a respective one of the plurality of temperature sensors, each sensor holder bore extending from a front face of the back plate to a back face of the back plate.

16. A system for performing a selenization process, comprising:

a unitary body fabricated from a single block of graphite, wherein the body comprises a back plate, and a pair of spaced apart, substantially parallel, side rails, wherein each of the side rails comprises:

an inwardly facing surface extending outwardly of the back plate;

a longitudinally extending selenium vapor bore formed therein, the selenium vapor bore being coupled to a selenium supply container for receiving selenium vapor;

at least one selenium vapor outlet disposed between the selenium vapor bore and the inwardly facing surface so as provide at least one conduit between the selenium vapor bore and the inwardly facing surface;

a longitudinally extending engagement slot formed in the inwardly facing surface of each side rail adjacent the back plate to engage and hold a substrate in proximity to the back plate; ;

a heat source positioned to heat the substrate in range of 500 to 550 degrees Celsius;

a temperature sensor configured to measure a temperature of the substrate; and a controller coupled to the heat source and the temperature sensor, wherein the controller is configured to control the heat source to maintain the substrate at a substantially constant temperature and, based on at least one signal from the temperature sensor, to determine whether the substrate experiences a temperature drop of three to four degrees Celsius during application of the selenium vapor to the substrate due to phase changes and reactions occurring during processing, wherein when the controller determines the temperature drop of three to four degrees Celsius, the controller is further configured to turn off the heat source and end the selenization process.

17. The system of claim 16, wherein the back plate comprises a plurality of sensor holder bores.

18. The system of claim 16, further comprising:

at least one temperature sensor in contact with or in proximity to the substrate through at least one sensor holder bore.

19. The system of claim 16, wherein the at least one selenium vapor outlet comprises a plurality of selenium vapor outlets is substantially uniformly spaced apart longitudinally.

20. The system of claim 16, wherein the back plate has a plurality of sensor holder bores, each sensor holder bore is configured to receive a respective one of a plurality of temperature sensors, each sensor holder bore extending from a front face of the back plate to a back face of the back plate.

* * * * *